(12) United States Patent
Cho et al.

(10) Patent No.: US 11,378,721 B2
(45) Date of Patent: Jul. 5, 2022

(54) DISPLAY DEVICE

(71) Applicant: Samsung Display Co., Ltd., Yongin-si (KR)

(72) Inventors: Ye Won Cho, Hwaseong-si (KR); Dong Eun Lee, Asan-si (KR); Dong Jin Jeong, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/250,723

(22) PCT Filed: Aug. 27, 2019

(86) PCT No.: PCT/KR2019/010925
§ 371 (c)(1),
(2) Date: Feb. 24, 2021

(87) PCT Pub. No.: WO2020/060057
PCT Pub. Date: Mar. 26, 2020

(65) Prior Publication Data
US 2021/0181383 A1    Jun. 17, 2021

(30) Foreign Application Priority Data

Sep. 19, 2018  (KR) .................. 10-2018-0112082

(51) Int. Cl.
*G02B 1/14* (2015.01)
*G06K 9/00* (2022.01)
*G06V 40/13* (2022.01)
*G02B 1/08* (2006.01)

(52) U.S. Cl.
CPC .......... *G02B 1/14* (2015.01); *G06V 40/1318* (2022.01); *G02B 1/08* (2013.01)

(58) Field of Classification Search
CPC .......... G06K 9/0004; G02B 1/14; G02B 1/08
See application file for complete search history.

(56) References Cited

U.S. PATENT DOCUMENTS

| | | |
|---|---|---|
| 6,468,609 B2 | 10/2002 | Marien et al. |
| 8,350,275 B2 | 1/2013 | Yan et al. |
| 9,134,462 B2 | 9/2015 | Furusato |

(Continued)

FOREIGN PATENT DOCUMENTS

| | | |
|---|---|---|
| JP | 2012-211305 A | 11/2012 |
| KR | 10-0682963 B1 | 2/2007 |

(Continued)

OTHER PUBLICATIONS

International Search Report dated Jan. 17, 2020, for corresponding Application No. PCT/KR2019/010925 filed Jan. 17, 2020, 4 pages.

*Primary Examiner* — Lixi C Simpson
(74) *Attorney, Agent, or Firm* — Lewis Roca Rothgerber Christie LLP (57) ABSTRACT

A display device includes: a display panel including a substrate, and an organic light emitting element; an ultraviolet ray blocking part on a rear surface of the substrate of the display panel; a rear protection layer on a rear surface of the ultraviolet ray blocking part, and having an opening; and a sensor in the opening of the rear protection layer. The ultraviolet ray blocking part includes polyester.

18 Claims, 10 Drawing Sheets

(56) References Cited

U.S. PATENT DOCUMENTS

| | | | |
|---|---|---|---|
| 2007/0182314 A1* | 8/2007 | Oh | H01L 51/5256 313/500 |
| 2012/0080671 A1* | 4/2012 | Niboshi | H01L 51/524 257/40 |
| 2013/0034710 A1* | 2/2013 | Paolilli | C08J 7/0427 428/216 |
| 2015/0376357 A1* | 12/2015 | Ebata | C08J 5/18 428/688 |
| 2016/0195651 A1* | 7/2016 | Yoshioka | B32B 7/00 359/359 |
| 2017/0300736 A1* | 10/2017 | Song | G06K 9/0004 |
| 2018/0031884 A1 | 2/2018 | Liu et al. | |
| 2018/0039150 A1 | 2/2018 | Lo et al. | |
| 2018/0068159 A1 | 3/2018 | Benkley, III et al. | |
| 2018/0151641 A1 | 5/2018 | Choo et al. | |
| 2019/0073505 A1* | 3/2019 | Kwon | H05K 1/0203 |
| 2019/0205603 A1* | 7/2019 | Lee | H01L 27/3225 |

FOREIGN PATENT DOCUMENTS

| | | |
|---|---|---|
| KR | 10-1758295 B1 | 7/2017 |
| KR | 10-2017-0119623 A | 10/2017 |
| KR | 10-1851673 B1 | 4/2018 |
| KR | 10-2018-0059720 A | 6/2018 |
| WO | WO 2016/167228 A1 | 10/2016 |

* cited by examiner

DISPLAY DEVICE

CROSS-REFERENCE TO RELATED APPLICATION

This application is a U.S. National Phase patent application of International Application No. PCT/KR2019/010925, filed on Aug. 27, 2019, which claims priority to Korean Patent Application No. 10-2018-0112082, filed in the Korean Intellectual Property Office on Sep. 19, 2018, the entire content of all of which is incorporated herein by reference.

BACKGROUND

1. Field

Aspects of example embodiments of the present disclosure relate to a display device, and more specifically, to a display device having a sensor on a back of a display panel.

2. Description of the Related Art

As use of mobile phones has been generalized, various functions other than a phone call are included in the mobile phones. In addition, the use of the mobile phone in a form of a smartphone capable of surfing the web through an Internet connection and operating various applications has been generalized.

Various applications are not only operated through information input by the user, but are also operated using signals from sensors built into the mobile phone. Particularly, for security purposes, sensors capable of detecting a user's identity are also being built into a mobile phone.

The above information disclosed in this Background section is for enhancement of understanding of the background of the present disclosure, and therefore, it may contain information that does not constitute prior art.

SUMMARY

Exemplary embodiments are directed to a display device including a sensor on the rear surface of a display panel, and more particularly, to preventing or substantially preventing degradation of the display panel due to ultraviolet rays used when fixing the sensor to a rear surface of the display panel.

A display device according to an exemplary embodiment includes: a display panel including a substrate, and an organic light emitting element; an ultraviolet ray blocking part on a rear surface of the substrate of the display panel; a rear protection layer on a rear surface of the ultraviolet ray blocking part, and having an opening; and a sensor in the opening of the rear protection layer. The ultraviolet ray blocking part includes polyester.

The ultraviolet ray blocking part may be configured to block ultraviolet rays, and may have a transparent characteristic to transmit visible rays.

The ultraviolet ray blocking part may have visible ray transmittance of 70% or more.

The ultraviolet ray blocking part may be configured to block the ultraviolet rays having a wavelength in a range of 200 nm to 400 nm.

The sensor may include a fingerprint sensor.

The polyester may be formed by a screen printing method.

The display device may further include a resin layer fixing a side surface of the sensor and the rear surface of the ultraviolet ray blocking part.

The display device may further include a double-sided adhesive tape attaching an upper surface of the sensor to the rear surface of the ultraviolet ray blocking part.

The substrate of the display panel may include glass.

The display device may further include a polarizer on a front surface of the display panel, and a window on a front surface of the polarizer.

The rear protection layer may include an embossing layer having an uneven surface arranged toward the ultraviolet ray blocking part.

The rear protection layer may further include a cushion layer on a rear surface of the embossing layer.

The rear protection layer may further include a shielding layer including a black layer or a metal, the shielding layer being configured to block ultraviolet rays and visible rays.

A display device according to an exemplary embodiment includes: a display panel including a substrate, and an organic light emitting element; an ultraviolet ray blocking part on a rear surface of the substrate of the display panel; a rear protection layer on a rear surface of the ultraviolet ray blocking part, and having an opening; and a sensor in the opening of the rear protection layer. The ultraviolet ray blocking part includes a film configured to block ultraviolet rays, and having a transparent characteristic to transmit visible rays.

The film of the ultraviolet ray blocking part may have visible ray transmittance of 70% or more.

The ultraviolet ray blocking part may be configured to block the ultraviolet rays having a wavelength in a range of 200 nm to 400.

The sensor may include a fingerprint sensor.

The display device may further include a resin layer fixing a side surface of the sensor and the rear surface of the ultraviolet ray blocking part.

The display device may further include a double-sided adhesive tape attaching an upper surface of the sensor to the rear surface of the ultraviolet ray blocking part.

The substrate of the display panel may include glass.

According to one or more exemplary embodiments of the present disclosure, when fixing the sensor to the rear surface of the display panel, ultraviolet rays are irradiated to the resin to be fixed, and the ultraviolet rays may be blocked by an ultraviolet ray blocking part according to one or more exemplary embodiments, such that an organic emission layer in the display panel may not be degraded due to the ultraviolet rays.

BRIEF DESCRIPTION OF THE DRAWINGS

The above and other aspects and features of the present disclosure will become more apparent to those skilled in the art from the following detailed description of the example embodiments with reference to the accompanying drawings.

DETAILED DESCRIPTION

Hereinafter, example embodiments of the present disclosure will be described in more detail with reference to the accompanying drawings, in which exemplary embodiments of the present disclosure are shown. As those skilled in the art would realize, the described embodiments may be modified in various different ways, all without departing from the spirit or scope of the present disclosure.

In describing the example embodiments of the present disclosure, parts that are not related to the description may be omitted. Like reference numerals generally designate like elements throughout the specification.

In addition, the size and thickness of each configuration shown in the drawings are arbitrarily shown for better understanding and ease of illustration, but the present disclosure is not limited thereto. In the drawings, the thickness of layers, films, panels, regions, etc., are exaggerated for clarity. In the drawings, for better understanding and ease of illustration, the thicknesses of some layers and areas are exaggerated.

It will be understood that when an element such as a layer, film, region, or substrate is referred to as being "on" another element, it can be directly on the other element or one or more intervening elements may also be present. In contrast, when an element is referred to as being "directly on" another element, there are no intervening elements present. Further, as used in the specification, the word "on" or "above" refer to positions on or below the object portion, and does not necessarily refer to a position on the upper side of the object portion based on a gravitational direction.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

In addition, unless explicitly described to the contrary, the words "comprise", "include", and "have", and variations such as "comprises", "comprising", "includes", "including", "has", or "having", will be understood to imply the inclusion of the stated elements but not the exclusion of any other elements.

As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Throughout the specification, the phrases "on a plane" and "in a plan view" refer to a view of the object portion from the top (e.g., a view of the object portion from a direction that is perpendicular or substantially perpendicular to a top surface of the object portion), and the phrases "on a cross-section" and "in a cross-sectional view" refer to a view of a cross-section of which the object portion is vertically cut from the side.

A structure of a display device according to an exemplary embodiment is described with reference to FIG. 1 to FIG. 3.

First, a constituent element of a display device according to an exemplary embodiment is described with reference to FIG. 1.

Figure 1:
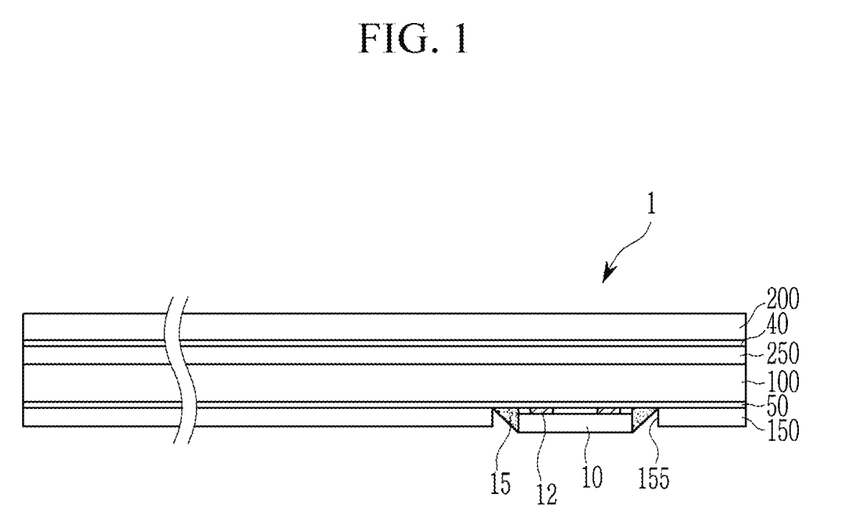
FIG. 1 is a cross-sectional view of a display device according to an exemplary embodiment.

FIG. 1 is a cross-sectional view of a display device according to an exemplary embodiment.

A display device 1 according to an exemplary embodiment includes a display panel 100, a window 200, a polarizer 250, an adhesive layer 40, an ultraviolet ray blocking part (e.g., an ultraviolet ray blocking portion or layer) 50, a rear protection layer 150 including an opening 155, and a sensor 10. The display device 1 further includes a double-sided adhesive tape 12 and a resin layer 15, to adhere (e.g., to connect or to attach) the sensor 10 to the ultraviolet ray blocking part 50.

The display panel 100 according to an exemplary embodiment uses an organic light emitting panel. In other words, a separate light unit is not included, and an organic emission layer capable of emitting light by itself (e.g., capable of self-emitting light) is included. As a result, the rear surface of the substrate for the display panel is exposed, as the substrate may be on the rear surface of the display panel 100. The display panel 100 of the present exemplary embodiment uses a glass substrate, and according to an exemplary embodiment, a flexible substrate having high light transmittance may be used.

The organic light emitting panel 100 is largely divided into a pixel circuit unit (e.g., a pixel circuit), and a light-emitting element unit (e.g., a light-emitting element), and may further include an encapsulation layer to cover the pixel circuit unit and the light-emitting element unit to prevent or substantially prevent moisture from penetrating from the outside. One pixel includes one pixel circuit unit (e.g., one pixel circuit) and one light-emitting element unit (e.g., one light-emitting element), and the encapsulation layer may be integrally formed throughout the display panel 100.

The pixel circuit unit is a part that applies a current to the light-emitting element unit based on signals applied from the outside, and is disposed on the upper surface of the substrate of the display panel. On the other hand, the light-emitting element unit is disposed on the pixel circuit unit, and includes an organic emission layer. The current output by the pixel circuit unit flows in the organic emission layer, and a degree to which the organic emission layer emits light changes according to a magnitude of the current.

The organic emission layer includes an organic light emitting material, and when combined with moisture, the organic light emitting material has a drawback with low efficiency. Accordingly, side and top surfaces of the pixel circuit unit and the light-emitting element unit are sealed with the encapsulation layer, so that moisture may not penetrate from the outside. The encapsulation layer may have a structure including a plurality of layers of organic layers and inorganic layers, and may include a triple layered structure of an inorganic layer, an organic layer, and an inorganic layer.

The polarizer 250 and the window 200 are disposed on the upper side of the display panel 100, or in other words, the front surface of the display panel 100, and may include the adhesive layer 40 for attaching the window 200 and the polarizer 250 to each other.

The polarizer 250 is attached to prevent or substantially prevent the quality of the display image from deteriorating as light incident from the outside is reflected inside the display panel 100, and to prevent or substantially prevent an electrode pattern inside the display panel 100 from being recognized by a user. Depending on an exemplary embodiment, the polarizer 250 may be omitted.

The window 200 serves to protect the front of the display panel 100. According to an exemplary embodiment, the window 200 may prevent or substantially prevent external light from being reflected and eyes from being dazzled when the user views the display device 1, and/or a fingerprint from being left when the user touches the window 200 with a finger.

The adhesive layer 40 is disposed between the window 200 and the polarizer 250 to attach the polarizer 250 and the window 200 to each other. The adhesive layer 40 may be an optically transparent adhesive material (e.g., an optically clear adhesive (OCA)) or a resin (e.g., an optically clear resin (OCR)).

According to an exemplary embodiment, a touch sensing unit (e.g., a touch sensor, a touch sensing layer, or a touch sensing panel) capable of detecting a touch may be further included at the inside of the display panel 100, or at the upper side of the display panel 100. In other words, a sensing electrode capable of sensing the touch may be further formed at (e.g., in or on) the display panel 100, or a separate substrate may be further formed between the display panel 100 and the polarizer 250, and a touch sensing electrode may be formed on the corresponding substrate (e.g., on the separate substrate).

The rear surface of the substrate for the display panel is exposed as the substrate is on the lower portion of the display panel 100, or in other words, the rear surface of the display panel 100. Because the present exemplary embodiment uses a glass substrate, the rear surface of the glass substrate is exposed. The ultraviolet ray blocking part 50 is formed on the rear surface of the substrate for the display panel 100. The ultraviolet ray blocking part 50 has a characteristic such that transmittance of visible ray light is high, and ultraviolet rays are blocked or substantially blocked. In other words, the ultraviolet ray blocking part 50 may be a transparent characteristic layer that blocks or substantially blocks ultraviolet rays. The ultraviolet ray blocking part 50 blocks or substantially blocks ultraviolet rays, and may be formed by coating a transparent visible material that has a suitable transmission (e.g., a good transmission) of visible rays.

In addition, according to an exemplary embodiment, the ultraviolet ray blocking part 50 may be formed by attaching a transparent film having a suitable transmission (e.g., having a good transmission) of visible rays from among ultraviolet ray blocking films.

The higher the visible ray transmittance of the ultraviolet ray blocking part 50 the better, and in order to detect the fingerprint of the user disposed at (e.g., in or on) the front surface of the display panel 100, it may be desirable for the ultraviolet ray blocking part 50 to have a transmittance of 70% or more in the visible ray wavelength band. When the transmittance is less than 70%, the fingerprint recognition rate of the sensor 10 may be reduced.

The wavelength band of the ultraviolet rays that are blocked or substantially blocked by the ultraviolet ray blocking part 50 may be in a range of 200 nm to 400 nm, and ultraviolet rays may be blocked or substantially blocked around the wavelengths of around 365 nm. As such, a suitable material having a high visible ray transmission characteristic while blocking or substantially blocking ultraviolet rays may be polyester. Accordingly, the ultraviolet ray blocking part 50 may be formed by directly coating polyester to the rear surface of the substrate of the display panel 100 by using a direct screen printing method. In general, the material used for the screen printing method may be gray, and may have a low visible ray transmission characteristic. On the other hand, the layer coated with polyester may have the high visible ray transmission characteristic, and may also block or substantially block ultraviolet rays therein, and thus, the layer coated with polyester may include a material that is suitable for the ultraviolet ray blocking part 50 in the present exemplary embodiment.

The rear protection layer 150 having the opening 155 is formed on the rear surface of the ultraviolet ray blocking part 50. The rear protection layer 150 may include a black layer having a black color in order to make it appear more black when displaying black on the organic light emitting panel 100. In addition, a cushion layer or an embossing layer may be included to prevent or substantially prevent the rear surface of the display panel 100 from breaking. Further, various suitable layers, for example, such as an adhesive layer and/or a shielding layer, may be included.

FIG. 1 shows that the rear protection layer 150 is disposed only on the rear surface of the ultraviolet ray blocking part 50 to protect the rear surface of the display device 1, but the present disclosure is not limited thereto, and according to an exemplary embodiment, the rear protection layer 150 may also extend to the side surface of the display panel 100 to protect the side surface of the display panel 100.

The sensor 10 is disposed in the opening 155 of the rear protection layer 150.

The sensor 10 used in the present exemplary embodiment may be a sensor that detects the user's finger at (e.g., in or on) the front surface of the display panel 100, and thus, a fingerprint sensor is described as an example of the sensor 10 for convenience in more detail below.

In the present exemplary embodiment, the reason that the sensor 10 is disposed in the opening 155 of the rear protection layer 150 is to detect the user's finger at (e.g., in or on) the front of the display panel 100. In addition, for this purpose, the ultraviolet ray blocking part 50 may have a high level of visible ray transmission. For example, the transmittance of visible rays of the ultraviolet ray blocking part 50 has been described above as 70% or more.

The upper surface of the sensor 10 according to the present exemplary embodiment is attached to the rear surface of the ultraviolet ray blocking part 50 by the double-sided adhesive tape 12, and the side surface of the sensor 10 is attached to the ultraviolet ray blocking part 50 by the resin layer 15. According to an exemplary embodiment, the resin layer 15 may also be attached to the rear protection layer 150 in addition to the ultraviolet ray blocking part 50.

First, the double-sided adhesive tape 12 may be formed of a material having a transparent characteristic, or a material having an opaque characteristic. In the position where the double-sided adhesive tape 12 is attached, because the efficiency of the sensor 10 in sensing the front surface of the display panel 100 may decrease, the position of the double-sided adhesive tape 12 may be disposed around a part where a detection region of the sensor 10 is not located. However, when the double-sided adhesive tape 12 is transparent and has little influence on the detection capabilities of the sensor 10, the double-sided adhesive tape 12 may be disposed at (e.g., in or on) the detection region of the sensor 10. When the opaque double-sided adhesive tape 12 is used, the detection region of the sensor 10 and the double-sided adhesive tape 12 may be disposed so as to not overlap with each other. The double-sided adhesive tape 12 may be kept in a pre-fixed state before being completely fixed by the resin layer 15. When the double-sided adhesive tape 12 is used, the position of the sensor 10 may be fixed before being fixed by the resin layer 15, and there is a merit in that distances between the sensor 10, the ultraviolet ray blocking part 50, and the rear surface of the display panel 100 may be kept narrow (e.g., may be decreased).

On the other hand, the resin layer 15 may include a material that is cured by ultraviolet rays, and thus, may be cured by ultraviolet rays so that the sensor 10 is fixed to the rear surface of the ultraviolet ray blocking part 50. Compared to the double-sided adhesive tape 12, the strength of the cured resin layer 15 is high, so that the sensor 10 may be completely fixed. However, in order to cure the resin layer 15, ultraviolet rays may be applied for a suitable period of time (e.g., a predetermined or a certain period of time), and thus, there may be a drawback in that the curing of the resin layer 15 using the ultraviolet rays may cause defects in the display panel 100.

The sensor 10 according to the present exemplary embodiment is shown as being fixed by the double-sided adhesive tape 12 and the resin layer 15, but the present disclosure is not limited thereto, and according to an exemplary embodiment, the sensor 10 may be fixed only by the resin layer 15.

Hereinafter, the structure of the rear surface and the front surface of the display device 1 according to the present exemplary embodiment is described in more detail with reference to FIG. 2 and FIG. 3.

Figure 2:
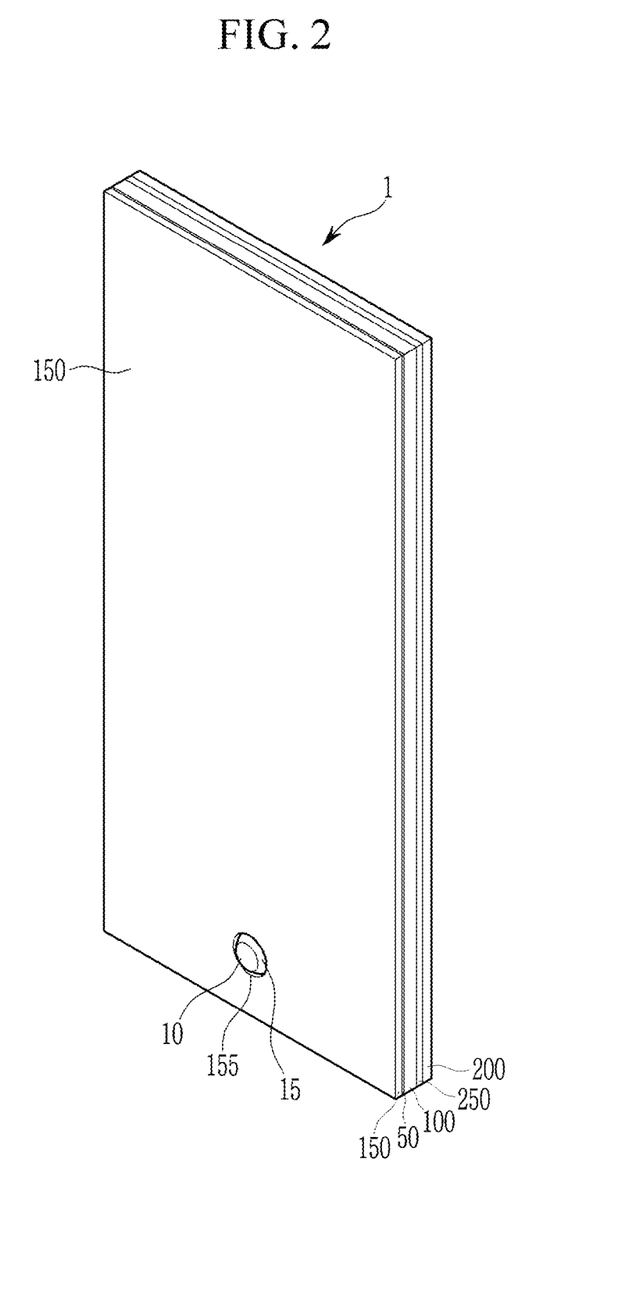
FIG. 2 is a rear perspective view of a display device according to an exemplary embodiment.
Figure 3:
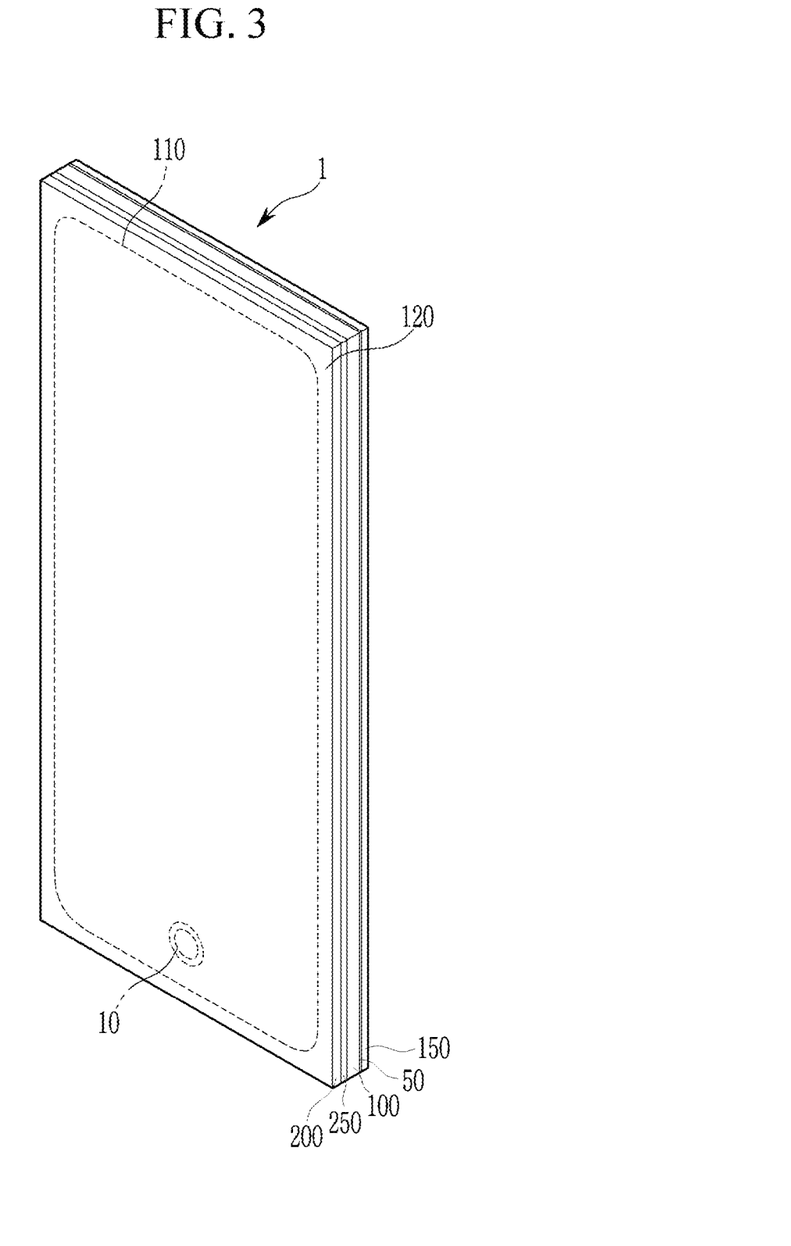
FIG. 3 is a front perspective view of a display device according to an exemplary embodiment.

FIG. 2 is a rear perspective view of a display device according to an exemplary embodiment, and FIG. 3 is a front perspective view of a display device according to an exemplary embodiment.

FIG. 2 and FIG. 3 show a case where the display device 1 is a display device used in a mobile phone or a smartphone as an exemplary embodiment.

First, referring to FIG. 2, the rear protection layer 150 is disposed on the rear surface of the display device 1 as a whole, the sensor 10 is disposed within the opening 155 of the rear protection layer 150, and the resin layer 15 that fixes the sensor 10 is applied around (e.g., to surround around a periphery of) the sensor 10.

Referring to FIG. 3, a display area 110 where an image is displayed is formed at (e.g., in or on) most regions of the display device 1, and a peripheral region 120 is formed at (e.g., in or on) the remaining regions of the display device 1. According to an exemplary embodiment, the display area 110 may entirely cover an entire surface of the display device 1, and according to an exemplary embodiment, the display area 110 may be disposed on a side surface of the display device 1.

In a part of the display area 110, a region is provided at (e.g., in or on) which the sensor 10 is disposed on the rear surface of the display device 1, such that the region may correspond to an area to detect the fingerprint (hereinafter referred to as a fingerprint sensing region). This region is shown by a dotted line around the sensor 10 in FIG. 3. FIG. 2 and FIG. 3 show an exemplary embodiment in which the region where the sensor 10 is disposed on the rear surface of the display device 1, or in other words, the fingerprint sensing region, is disposed within the display area 110 at a lower end of the display area 110. However, the present disclosure is not limited thereto, and according to an exemplary embodiment, the fingerprint sensing region may be disposed at another portion of the display area 110. The fingerprint sensing region may be formed at (e.g., in or on) various suitable positions depending on the use state of the electronic equipment in which the display device 1 is used, or may be formed at (e.g., in or on) two or more suitable positions.

When the user touches the fingerprint sensing region with the finger, the sensor 10, which is positioned on the rear surface of display panel 100 and the ultraviolet ray blocking part 50, detects the fingerprint of the finger. This is described in more detail below with reference to FIG. 4.

Figure 4:
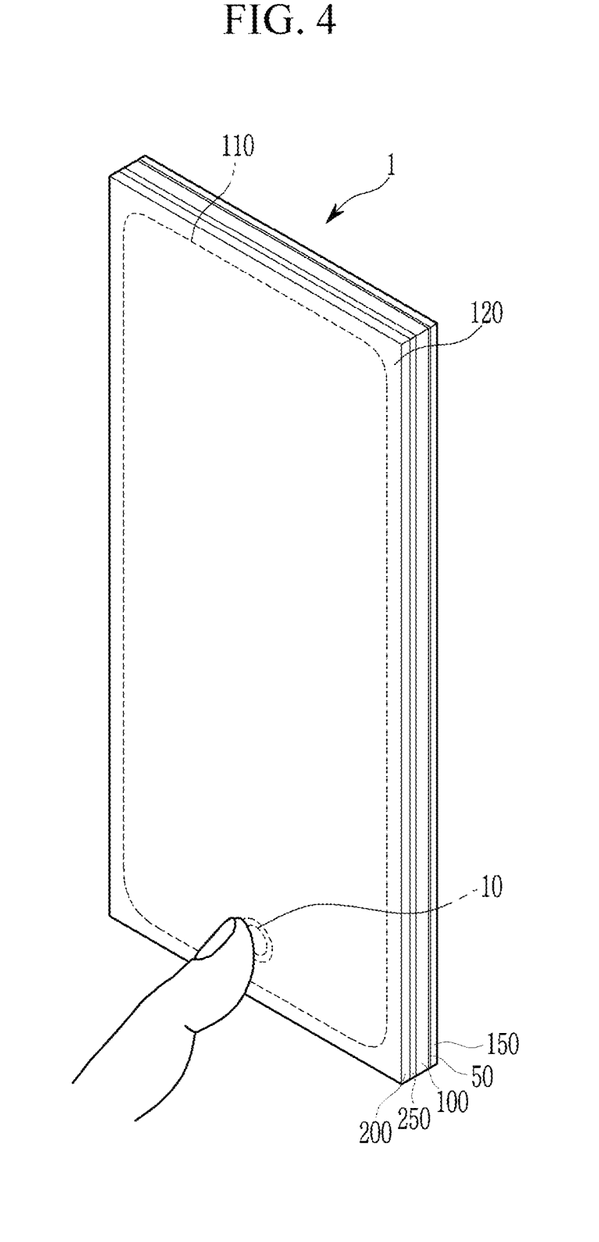
FIG. 4 is a view showing a use method of a display device according to an exemplary embodiment.

FIG. 4 shows a case where the user touches the finger on the fingerprint sensing region.

When the user places the finger on the fingerprint sensing region of the display area 110, the sensor 10 that is positioned on the rear surface of the display panel 100 detects the fingerprint of the finger. In this case, the window 200, the polarizer 250, the display panel 100, and the ultraviolet ray blocking part 50 are disposed between the sensor 10 and the finger. A method through which the sensor 10 detects the fingerprint of the finger uses light emitted from a pixel (e.g., light emitted from an organic emission layer) disposed at (e.g., in or on) the display area 110 of the display panel 100 that is reflected by the finger and transmitted to, and sensed by, the sensor 10 through the window 200, the polarizer 250, the display panel 100, and the ultraviolet ray blocking part 50 after being reflected by the finger. Unlike a method of shooting an image with a camera, because the sensing of the fingerprint of the finger may grasp the finger print pattern by detecting some parts of the finger, the detection (or sensing) may be possible even if a partial region (e.g., of the sensor 10) becomes hidden (or covered), for example, by the pixels of the display panel 100 as in the present exemplary embodiment.

A transparent layer may be disposed between the rear surface of the display panel 100 and the sensor 10. In other words, the ultraviolet ray blocking part 50 blocks or substantially blocks the ultraviolet rays, but the transmittance of visible rays is increased so as to transmit the light reflected from the finger. The ultraviolet ray blocking part 50 may be formed by coating polyester, or may be formed of an ultraviolet ray blocking film having high visible ray transmittance. For example, the transmittance of the visible rays of the ultraviolet ray blocking part 50 may be 70% or more.

Next, the characteristic of the ultraviolet ray blocking part 50 is described in more detail below with reference to FIG. 5.

Figure 5:
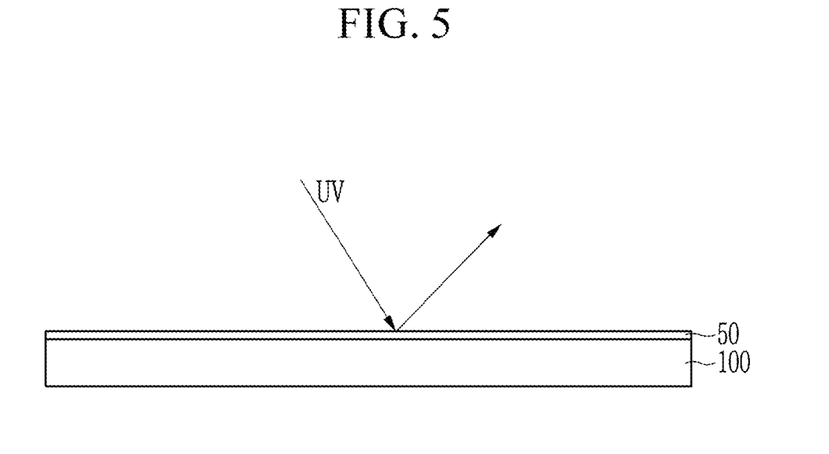
FIG. 5 is a view showing a characteristic of an ultraviolet ray blocking part of a display device according to an exemplary embodiment.

FIG. 5 is a view showing a characteristic of an ultraviolet ray blocking part of a display device according to an exemplary embodiment.

As described above, the ultraviolet ray blocking part 50 has a transparent characteristic to have a high transmittance for visible rays, and a blocking characteristic for blocking or substantially blocking ultraviolet rays. According to a method for blocking ultraviolet rays through the ultraviolet ray blocking part 50, as illustrated in FIG. 5, light of the ultraviolet ray wavelength band may be reflected, and according to an exemplary embodiment, light of the ultraviolet ray wavelength band may be absorbed.

The wavelength band of ultraviolet rays blocked or substantially blocked by the ultraviolet ray blocking part 50 is in a range of 200 nm to 400 nm, and may be blocked or reflected around the wavelengths around 365 nm. In addition, the transmittance of the visible rays may be suitably high.

A material having both of these characteristics is polyester. Polyester may be coated to the rear surface of the substrate of the display panel 100 by direct screen printing to form the ultraviolet ray blocking part 50. In general, the material coated by the screen printing method according to a comparative example has a gray color, such that the transmission characteristic of visible rays is lowered. On the other hand, the layer coated with polyester according to one or more example embodiments of the present disclosure not only exhibits the transparent characteristic with high visible ray transmission, but also has the characteristic that the layer coated with polyester blocks or substantially blocks ultraviolet rays. Thus, the layer coated with polyester may be a material suitable for the ultraviolet ray blocking part 50 of the present exemplary embodiment.

A film capable of blocking or substantially blocking ultraviolet rays may be formed by attaching the film to the rear surface of the display panel 100, and such a film may also have a high visible ray transmission characteristic. The higher the transmittance, the greater the amount of reflected light entering the sensor 10, thereby improving the fingerprint sensing characteristic of the sensor 10. In the present exemplary embodiment, the transmittance of visible ray may be 70% or more.

Hereinafter, a procedure for attaching the sensor 10 is described in more detail below with reference to FIG. 6 and FIG. 7.

Figure 6:
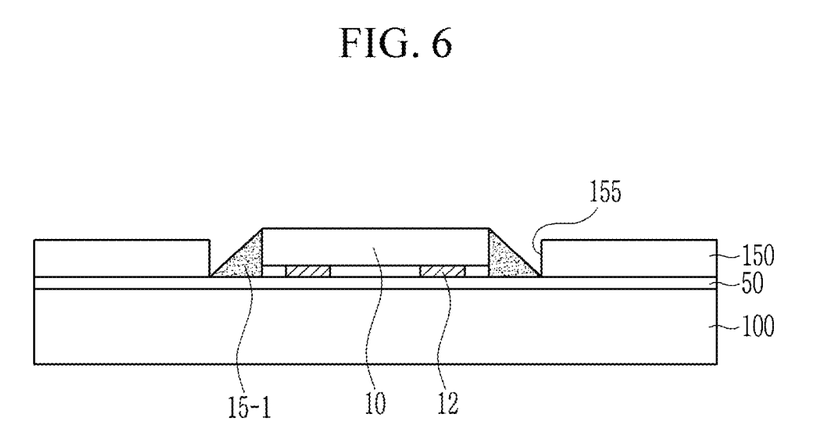
FIGS. 6-7 are views showing a manufacturing method of a display device according to an exemplary embodiment.
Figure 7:
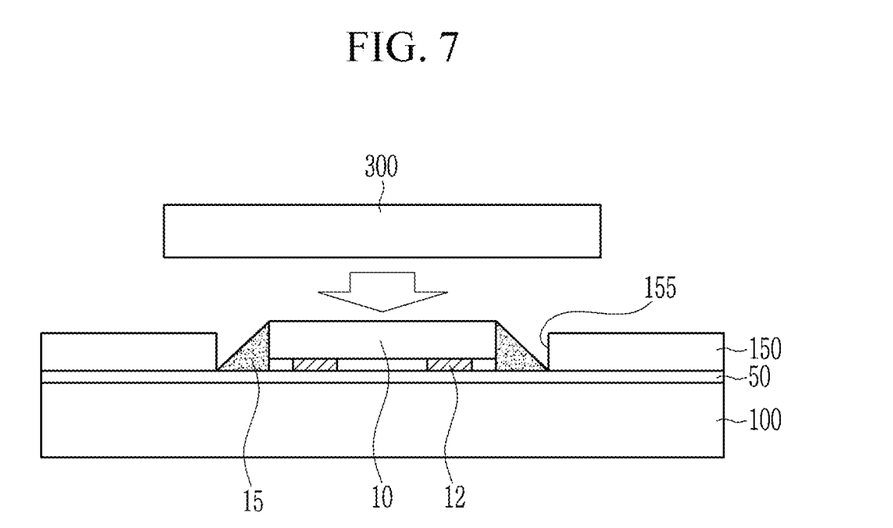

FIG. 6 and FIG. 7 are views showing a manufacturing method of a display device according to an exemplary embodiment.

In FIG. 6 and FIG. 7, a structure of the front part of the display panel 100 is not shown.

The ultraviolet ray blocking part 50 is formed on the rear surface of the display panel 100. As shown in FIG. 5, the ultraviolet ray blocking part 50 may be formed by coating polyester on the rear surface of the display panel 100, or attaching an ultraviolet ray blocking film having high visible ray transmittance to the rear surface of the display panel 100.

Thereafter, a rear protection layer 150 having an opening 155 is formed on the rear surface of the ultraviolet ray blocking part 50. The position of the opening 155 may differ according to various exemplary embodiments, and corresponds to a region where the sensor 10 is to be attached.

Thereafter, a double-sided adhesive tape 12 is formed on a portion of the ultraviolet ray blocking part 50 exposed through the opening 155, and the sensor 10 is temporarily fixed to the ultraviolet ray blocking part 50 by using the double-sided adhesive tape 12. In this way, a position of the temporarily-fixed sensor 10 may not change during the time it takes to later form the resin layer 15.

After the sensor 10 is temporarily fixed, as shown in FIG. 6, a resin material 15-1 is formed around (e.g., to surround around a periphery of) the sensor 10.

FIG. 7 shows that ultraviolet rays are irradiated onto the resin material 15-1 formed around the sensor 10 shown in FIG. 6. In other words, ultraviolet rays (UV) are irradiated to the rear surface of the display panel 100 by using an ultraviolet ray light source 300. The resin material 15-1 is cured by the irradiated ultraviolet rays to become a resin layer 15, and as a result, the sensor 10 is completely attached (e.g., is firmly attached) to the rear surface of the ultraviolet ray blocking part 50.

The ultraviolet rays irradiated from the rear surface of the display panel 100 are blocked or substantially blocked by the rear protection layer 150, such that the ultraviolet rays are not transmitted to the display panel 100. In the rear protection layer 150, according to an exemplary embodiment, a black layer, an embossing layer, a cushion layer, a shielding layer, and/or the like may be selectively formed, and at least one layer from among these layers may have a black color, so that visible rays are not transmitted to the display panel 100 and the ultraviolet rays are blocked or substantially blocked.

On the other hand, in the portion where the opening 155 of the rear protection layer 150 is formed, the ultraviolet ray blocking part 50 is formed so that ultraviolet rays do not enter (e.g., are not transmitted to) the display panel 100. Although visible rays may be transmitted, when the display device 1 is included in electronic equipment, the display device 1 may be covered by a separate case so that there are almost no visible rays transmitted from the lower portion of the ultraviolet ray blocking part 50 to the display panel 100.

Hereinafter, a problem that may occur when ultraviolet rays enter the display panel is described below with reference to FIGS. 8A and 8B.

Figure 8A:
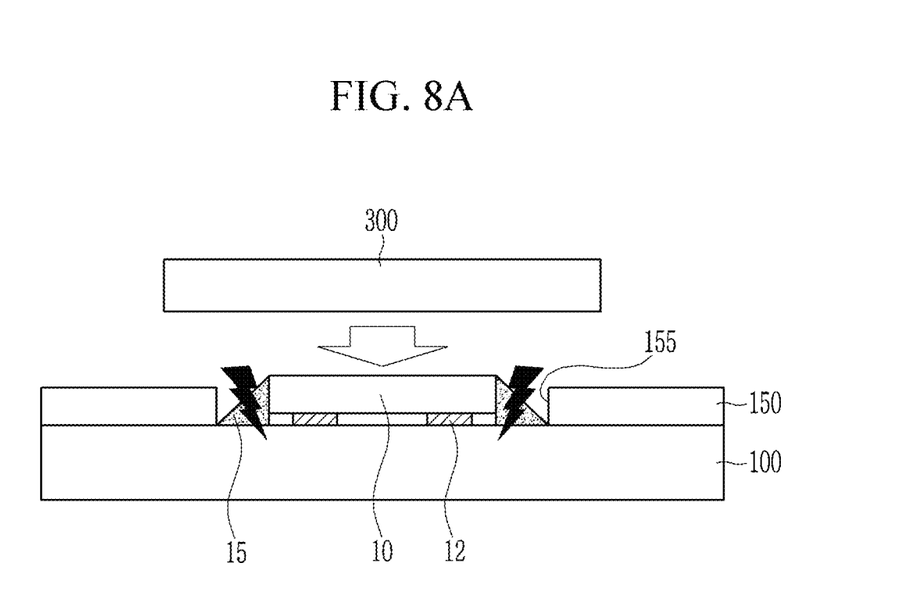
FIGS. 8A-8B are views showing a structure of a display device according to a comparative example, and a stain recognized according thereto.
Figure 8B:
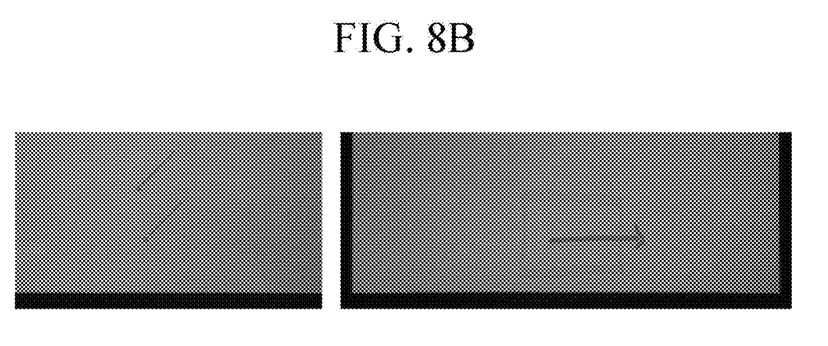

FIGS. 8A and 8B are views showing a structure of a display device according to a comparative example, and a stain that is recognized according thereto.

FIG. 8A shows a comparative example in which an ultraviolet ray blocking part 50 is not formed on the rear surface of the display panel 100, unlike the exemplary embodiment of FIG. 7.

When ultraviolet rays are applied using the ultraviolet ray light source 300 in the comparative example of FIG. 8A, ultraviolet rays enter the display panel 100 through the opening 155 of the rear protection layer 150. In order to cure the resin layer 15, ultraviolet rays may be irradiated for a certain or predetermined time to provide a suitable light energy to the resin material 15-1. However, this light energy may also affect the elements of the display panel 100, and as a result, as shown in FIG. 8B, stains may be recognizable on the display panel 100. In other words, as the light energy provided by the ultraviolet ray light source 300 degrades the organic light emitting element of the display panel 100, the stains due to the degradation thereof may be recognized from the front of the display panel 100.

However, according to the present exemplary embodiment, the ultraviolet ray blocking part 50 is disposed on the rear surface of the display panel 100, so that ultraviolet rays do not enter the display panel 100 even through the opening 155 of the rear protection layer 150, thereby preventing or reducing the degradation of the organic light emitting element. As a result, the stain may not be recognized from the front of the display panel 100.

According to an exemplary embodiment, the ultraviolet ray blocking part 50 may not be entirely formed on the rear surface of the display panel 100. In other words, because the ultraviolet ray blocking part 50 may prevent or substantially prevent the ultraviolet rays from entering through the opening 155 of the rear protection layer 150, the ultraviolet ray blocking part 50 may be disposed only at the opening 155 (e.g., only at a center of the opening 155). For example, in some exemplary embodiments, the ultraviolet ray blocking part 50 may overlap with the region of the opening 155, and may be disposed to be wider (e.g., to be slightly wider) than the region of the opening 155.

A layered structure of the rear protection layer 150 according to an exemplary embodiment is described in more detail below with reference to FIG. 9.

Figure 9:
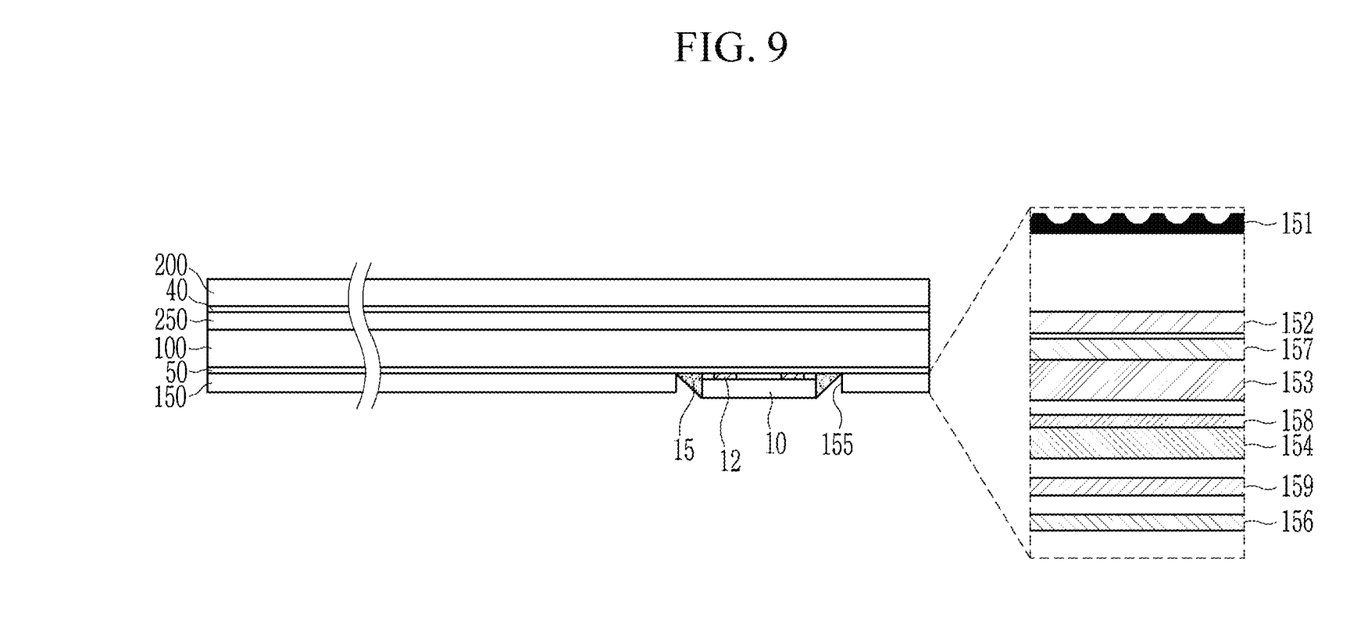
FIG. 9 is a view showing a detailed structure of a rear protection layer in a display device according to an exemplary embodiment.

FIG. 9 is a view showing a detailed structure of a rear protection layer in a display device according to an exemplary embodiment.

The rear protection layer 150 may include a multi-layered structure (e.g., may not be composed of a single layer), and may have a configuration selectively including various suitable layers, for example, such as an embossing layer, a cushion layer, a black layer, and a shielding layer.

FIG. 9 shows the configuration of the rear protection layer 150 in more detail according to an exemplary embodiment.

The rear protection layer 150 according to the exemplary embodiment of FIG. 9 includes an embossing layer 151, a cushion layer (e.g., 152 and 153) including two layers, a black layer 154, a shielding layer 159, a cover layer 156, and an adhesive layer (e.g., 157 and 158).

First, the embossing layer 151 of the rear protection layer 150 is disposed on the rear surface of the display panel 100 and the rear surface of the ultraviolet ray blocking part 50. The embossing layer 151 has an uneven surface, and serves to reduce an impact from the outside. In addition, the embossing layer 151 is also formed of a black color material to block or substantially block light or ultraviolet rays. The uneven surface of the embossing layer 151 is disposed towards the rear surface of the display panel 100 and the ultraviolet ray blocking part 50.

On the rear surface of embossing layer 151, two layers of the cushion layer (152 and 153) are disposed. The adhesive layer 157 is disposed between the two layers 152 and 153 of the cushion layer to attach the two cushion layers 152 and 153 to each other. The two cushion layers 152 and 153 may each include an air layer therein, and may serve to buffer the impact from the outside as a result. The cushion layers 152 and 153 may be formed of different materials from each other and/or may have different thicknesses from each other. The adhesive layer 157 disposed between the two cushion layers 152 and 153 may be an optically transparent adhesive material or may use a resin (e.g., an optically clear adhesive (OCA) or an optically clear resin (OCR)).

On the rear surfaces of the cushion layers 152 and 153, a black layer 154 is attached by an adhesive layer 158. The black layer 154 is formed of a material that may block or substantially block light or ultraviolet rays, and the adhesive layer 158 may be formed of an adhesive material that does not have a transparent characteristic.

The embossing layer 151 and the black layer 154, which are formed of a black material, block or substantially block ultraviolet rays and visible rays to prevent or substantially prevent luminance from being reduced by light incident from the rear surface when the display panel 100 displays black.

The shielding layer 159 is formed on the rear surface of the black layer 154. The shielding layer 159 is formed of a metal, for example, such as copper (Cu). When the display device 1 is used as a component of the electronic equipment, the rear surface of the display device 1 may be attached to be in close contact with the electronic equipment for emitting electromagnetic waves, for example, such as a driving chip, an antenna, or a printed circuit board (PCB). In this case, the shielding layer 159 formed of a metal may be included to remove or reduce electromagnetic interference.

The cover layer 156 may be disposed on the rear surface of the shielding layer 159, and may be formed of an insulating material. The cover layer 156 covers the shielding layer 159 of the metal layer with the insulating material to protect other wiring layers and the shielding layer 159 from being electrically shorted.

The structure of the rear protection layer 150 of FIG. 9 as described above may have numerous variations. In other words, one of the included layers may be omitted, two or more of the same layer may be additionally included, or an adhesive may be additionally formed between the layers.

However, because the rear protection layer 150 may be used to block or substantially block visible rays and ultraviolet rays, at least one layer having this characteristic may be included in the rear protection layer 150, and the rear protection layer 150 may also have an impact smoothing characteristic to protect the substrate of the display panel 100 from an external impact.

In addition, a layer having one or more additional functions may be further included, if necessary or desired.

While this disclosure has been described in connection with what is presently considered to be practical exemplary embodiments, it is to be understood that the present disclosure is not limited to the disclosed embodiments. On the contrary, the present disclosure is intended to cover various modifications and equivalent arrangements included within the spirit and scope of the appended claims, and their equivalents.

<Description of symbols>

| | |
|---|---|
| 1: display device | 100: display panel |
| 110: display area | 120: peripheral area |
| 150: rear protection layer | 155: opening |
| 50: ultraviolet ray blocking part | 10: sensor |
| 200: window | 250: polarizer |
| 300: ultraviolet ray light source | 12: double-sided adhesive tape |
| 15: resin layer | 15-1: resin material |
| 40: adhesive layer | 151: embossing layer |
| 152, 153: cushion layer | 154: black layer |
| 156: cover layer | 157, 158: adhesive layer |
| 159: shielding layer | |

The invention claimed is:

1. A display device comprising:
   a display panel comprising a substrate, and an organic light emitting element;
   an ultraviolet ray blocking part on a rear surface of the substrate of the display panel;
   a rear protection layer on a rear surface of the ultraviolet ray blocking part, and having an opening;
   a sensor in the opening of the rear protection layer and configured to receive visible rays transmitted through the ultraviolet ray blocking part;
   a resin layer attached to a side surface of the sensor and the rear surface of the ultraviolet ray blocking part; and
   a double-sided adhesive tape attaching an upper surface of the sensor to the rear surface of the ultraviolet ray blocking part,
   wherein the ultraviolet ray blocking part comprises polyester, and
   wherein the resin layer is not attached to all of a side surface of the rear protection layer in the opening.

2. The display device of claim 1, wherein the ultraviolet ray blocking part is configured to block ultraviolet rays, and to transmit visible rays.

3. The display device of claim 2, wherein the ultraviolet ray blocking part has visible ray transmittance of 70% or more.

4. The display device of claim 3, wherein the ultraviolet ray blocking part is configured to block the ultraviolet rays having a wavelength in a range of 200 nm to 400 nm.

5. The display device of claim 1, wherein the sensor comprises a fingerprint sensor.

6. The display device of claim 1, wherein the polyester is formed by a screen printing method.

7. The display device of claim 1, wherein the substrate of the display panel comprises glass.

8. The display device of claim 1, further comprising:
a polarizer on a front surface of the display panel; and
a window on a front surface of the polarizer.

9. The display device of claim 1, wherein the rear protection layer comprises an embossing layer having an uneven surface facing the ultraviolet ray blocking part.

10. The display device of claim 9, wherein the rear protection layer further comprises a cushion layer on a rear surface of the embossing layer.

11. The display device of claim 10, wherein the rear protection layer further comprises a shielding layer comprising a black layer or a metal, the shielding layer being configured to block ultraviolet rays and visible rays.

12. A display device comprising:
a display panel comprising a substrate, and an organic light emitting element;
an ultraviolet ray blocking part on a rear surface of the substrate of the display panel;
a rear protection layer on a rear surface of the ultraviolet ray blocking part, and having an opening;
a sensor in the opening of the rear protection layer;
a resin layer attached to a side surface of the sensor and the rear surface of the ultraviolet ray blocking part; and
a double-sided adhesive tape attaching an upper surface of the sensor to the rear surface of the ultraviolet ray blocking part,
wherein the ultraviolet ray blocking part comprises a film configured to block ultraviolet rays, and to transmit visible rays to the sensor, and
wherein the resin layer is not attached to all of a side surface of the rear protection layer in the opening.

13. The display device of claim 12, wherein the film of the ultraviolet ray blocking part has visible ray transmittance of 70% or more.

14. The display device of claim 13, wherein the ultraviolet ray blocking part is configured to block the ultraviolet rays having a wavelength in a range of 200 nm to 400 nm.

15. The display device of claim 12, wherein the sensor comprises a fingerprint sensor.

16. The display device of claim 12, further comprising a resin layer attached to a side surface of the sensor and the rear surface of the ultraviolet ray blocking part.

17. The display device of claim 16, further comprising a double-sided adhesive tape attaching an upper surface of the sensor to the rear surface of the ultraviolet ray blocking part.

18. The display device of claim 12, wherein the substrate of the display panel comprises glass.

* * * * *